United States Patent
Maxim et al.

(10) Patent No.: US 10,187,016 B2
(45) Date of Patent: Jan. 22, 2019

(54) AMPLIFIER WITH IMPROVED LINEARITY

(71) Applicant: Qorvo US, Inc., Greensboro, NC (US)

(72) Inventors: George Maxim, Saratoga, CA (US); Kelvin Kai Tuan Yan, Oak Ridge, NC (US); Marcus Granger-Jones, Scotts Valley, CA (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 11 days.

(21) Appl. No.: 15/492,043

(22) Filed: Apr. 20, 2017

(65) Prior Publication Data
US 2018/0083575 A1  Mar. 22, 2018

Related U.S. Application Data

(60) Provisional application No. 62/396,259, filed on Sep. 19, 2016.

(51) Int. Cl.
*H03F 3/04* (2006.01)
*H03F 1/22* (2006.01)
*H03F 1/32* (2006.01)
*H03F 3/193* (2006.01)
*H03F 1/02* (2006.01)
*H03F 3/45* (2006.01)

(52) U.S. Cl.
CPC ........... *H03F 1/223* (2013.01); *H03F 1/0222* (2013.01); *H03F 1/3205* (2013.01); *H03F 1/3211* (2013.01); *H03F 3/193* (2013.01); *H03F 3/45188* (2013.01); *H03F 2200/294* (2013.01); *H03F 2200/451* (2013.01); *H03F 2203/45392* (2013.01)

(58) Field of Classification Search
CPC ........ H03F 1/0205; H03F 1/3205; H03F 3/19; H03F 1/223; H03F 3/45188; H03F 1/3211; H03F 1/0222; H03F 3/193
USPC .................................................. 330/311, 296
See application file for complete search history.

(56) References Cited

U.S. PATENT DOCUMENTS 8,680,928 B2 * 3/2014 Jeon ........................ H03F 1/223
330/311

* cited by examiner

*Primary Examiner* — Khiem Nguyen
(74) *Attorney, Agent, or Firm* — Withrow & Terranova, P.L.L.C.

(57) ABSTRACT

An amplifier having improved linearity is disclosed. The amplifier includes a main transistor having a first current input terminal, a first current output terminal, and a first control terminal coupled to an RF input terminal that receives a signal voltage. A cascode transistor has a second current input terminal coupled to an RF output terminal for outputting an amplified signal. The cascode transistor has a second control terminal, and a second current output terminal coupled to the first current input terminal. Linearization circuitry has a bias output terminal coupled to the second control terminal. The linearization circuitry is configured to generate a bias signal at the bias output terminal to maintain a quiescent point of the main transistor for a given load coupled to the RF output terminal such that output conductance of the main transistor decreases nonlinearly with increasing main voltage and increases nonlinearly with decreasing main voltage.

18 Claims, 6 Drawing Sheets

AMPLIFIER WITH IMPROVED LINEARITY

RELATED APPLICATIONS

This application claims the benefit of provisional patent application Ser. No. 62/396,259, filed Sep. 19, 2016, the disclosure of which is hereby incorporated herein by reference in its entirety.

FIELD OF THE DISCLOSURE

The present disclosure relates to amplifiers and in particular to low noise amplifiers having linearization circuitry.

BACKGROUND

Modern communications receivers employ amplifiers that must meet relatively stringent linearity specifications to address signal blocking conditions inherent to receiving concurrent communication channels that can include communication signals of various standards. What is needed is an amplifier with improved linearity.

SUMMARY

An amplifier having improved linearity is disclosed. The amplifier includes a radio frequency (RF) input terminal for receiving a signal voltage and an RF output terminal for outputting an amplified signal voltage. The amplifier also includes a main transistor having a first current input terminal, a first current output terminal, and a first control terminal coupled to the RF input terminal. A cascode transistor has a second control terminal, a second current input terminal coupled to the RF output terminal and a second current output terminal coupled to the first current input terminal. Linearization circuitry has a bias output terminal coupled to the second control terminal and is configured to generate a bias signal at the bias output terminal to maintain a quiescent point of the main transistor for a given load coupled to the RF output terminal such that output conductance of the main transistor decreases nonlinearly as a main voltage between the first current input terminal and the first current output terminal of the main transistor increases and increases nonlinearly as the main voltage between the first current input terminal and the first current output terminal of the main transistor decreases.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In this regard and for the purpose of this disclosure, a transistor's output conductance is defined as the inverse of resistance between a current input terminal and a current output terminal of the transistor. For a field-effect transistor (FET) a drain terminal is the current input terminal and a source terminal is the current output terminal. Therefore, the output conductance for a FET is its drain-to-source conductance gds. For a bipolar junction transistor (BJT) a collector terminal is the current input terminal and an emitter terminal is the current output terminal. Therefore, the output conductance for a BJT is its collector-to-emitter conductance gce. Embodiments of the present disclosure operate an amplifier in a region of nonlinear conductance to create distortion that cancels with distortion caused by nonlinear transconductance, thereby improving the linearity of the amplifier.

Figure 1:
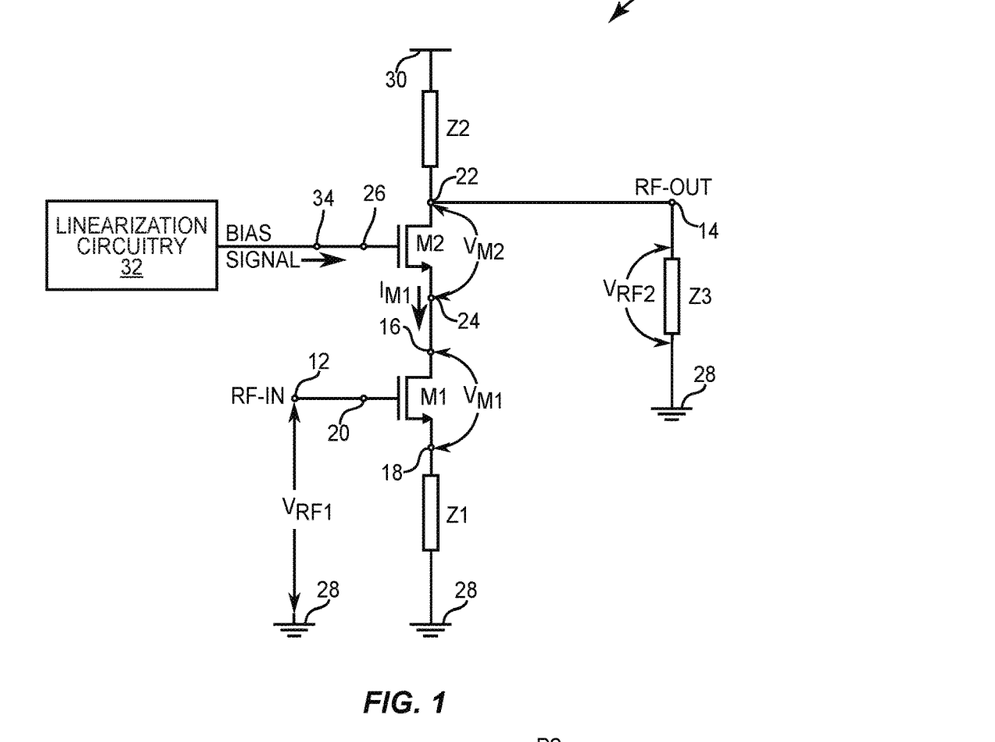
FIG. 1 is a circuit diagram of an amplifier with improved linearity in accordance with the present disclosure.

FIG. 1 is a circuit diagram of an amplifier 10 with improved linearity in accordance with the present disclosure. The amplifier 10 has a radio frequency (RF) input terminal 12 for receiving a signal voltage $V_{RF1}$ and an RF output terminal 14 for outputting an amplified signal voltage $V_{RF2}$. The amplifier 10 also includes a main transistor M1 having a first current input terminal 16, a first current output terminal 18, and a first control terminal 20 coupled to the RF input terminal 12. The amplifier 10 further includes a cascode transistor M2 having a second current input terminal 22 coupled to the RF output terminal 14, a second current output terminal 24 coupled to the first current input terminal 16, and a second control terminal 26. Main current $I_{M1}$ for the main transistor M1 is defined as a current entering the first current input terminal 16. Main voltage $V_{M1}$ for the main transistor M1 is defined as a voltage across the main transistor M1 from the first current input terminal 16 to the first current output terminal 18. A cascode voltage $V_{M2}$ is defined as a voltage across the cascode transistor M2 from the second current input terminal to the second current output terminal.

In an exemplary embodiment depicted in FIG. 1, the first current output terminal 18 is coupled to a first fixed voltage node 28 through a first impedance element Z1. In some embodiments, the first impedance element Z1 is eliminated and the first current output terminal 18 is coupled directly to the first fixed voltage node 28, which is ground in this exemplary embodiment. The second current input terminal 22 is coupled to a supply voltage node 30 though a second impedance element Z2. A given load element Z3 is coupled between the RF output terminal 14 and the first fixed voltage node 28.

The amplifier 10 further includes linearization circuitry 32 having a bias output terminal 34 coupled to the second control terminal 26. Linearization circuitry 32 is configured to generate a bias signal at the bias output terminal 34 to maintain a quiescent point (Q-point) of the main transistor M1 for the given load Z3 such that output conductance of the main transistor M1 decreases nonlinearly with increasing main voltage $V_{M1}$ and increases nonlinearly with decreasing main voltage $V_{M1}$.

Figure 2:
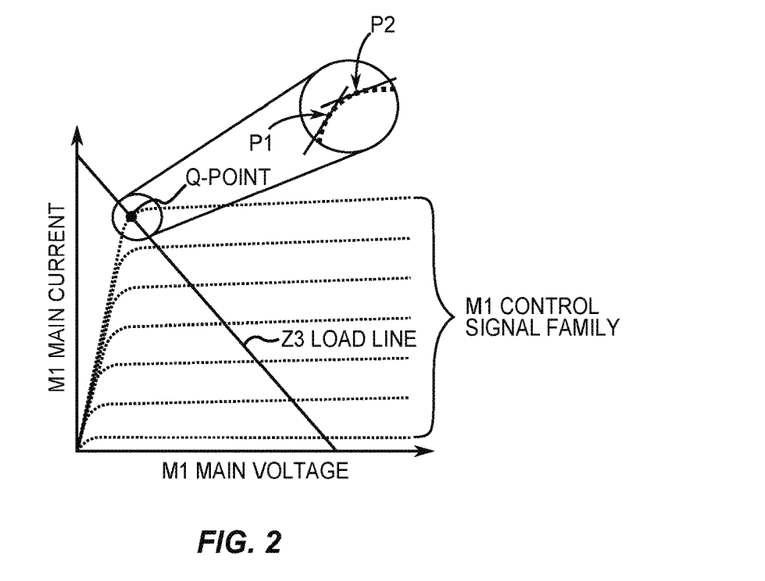
FIG. 2 is a graph of main current versus main voltage depicting a nonlinear conductance region for a control bias signal family for a main transistor of the amplifier.

FIG. 2 is a graph of main current versus main voltage for a control bias signal family for the main transistor M1. A control signal family for the main transistor M1 is made up of steps of bias signals that are applied to the first control terminal 20 (FIG. 1) to control current level for the main current $I_{M1}$. Main current $I_{M1}$ for a BJT is collector current, and main voltage $V_{M1}$ for a BJT is collector-to-emitter voltage. Main current $I_{M1}$ for a FET is drain current, and main voltage $V_{M1}$ for a FET is drain-to-source voltage. A bias signal for a BJT is base current and a bias signal for a FET is gate-to-source voltage.

An exemplary load line for the given load element Z3 is plotted across the graph of main current versus main voltage. The linearization circuitry 32 (FIG. 1) generates the bias signal that controls the current level of the main current $I_{M1}$, which in turn controls voltage level of the main voltage $V_{M1}$ by way of voltage drops across Z1, Z2, and M2 in this exemplary case. As depicted in FIG. 1, the voltage level of the main voltage $V_{M1}$ is maintained by the linearization circuitry 32 such that the Q-point is maintained within a region of non-linear conductance, which is shown bounded by a circle around the Q-point.

A magnification of the non-linear conductance region illustrates output conductance non-linearity by comparison of slopes at a first point P1 and a second point P2. When the linearization circuitry 32 (FIG. 1) increases the main voltage $V_{M1}$ from its voltage level at the first point P1 to its voltage level at the second point P2, a nonlinear decreasing of output conductance results as evidenced by lowering slope of tangent lines from the first point P1 to the second point P2. In contrast, when the linearization circuitry 32 decreases the main voltage $V_{M1}$ from its voltage level at the second point P2 to its voltage level at the first point P1, a nonlinear increase in output conductance results as evidenced by rising slope of tangent lines from the second point P2 to the first point P1.

The linearization circuitry 32 maintains the Q-point at a location within the nonlinear region to provide output conductance that produces inverse signal distortion to cancel inherent signal distortion of the signal voltage $V_{RF1}$ while undergoing amplification by amplifier 10. Distortion of the amplified signal voltage $V_{RF2}$ is reduced as the inverse signal distortion due to the nonlinear conductance of the main transistor M1 adds with inherent signal distortion caused by nonlinear transconductance gm of the main transistor M1.

The second point P2 is to the right of a knee for the main current $I_{M1}$ versus the main voltage $V_{M1}$ for the voltage level for the main voltage $V_{M1}$ at the second point P2. Provided that the main transistor is a FET and the Q-point is moved to the second point P2, the main transistor M1 would be operating in an early saturation region. For the purpose of this disclosure, the early saturation region for a FET transistor is defined as a region to the right of the knee and to the left of a saturation region having linear output conductance. In at least some embodiments, wherein the main transistor M1 is FET based, the Q-point is maintained within the early saturation region to provide a nonlinear drain-to-source conductance gds that produces inverse signal distortion to cancel with inherent signal distortion of the signal voltage $V_{RF1}$ while undergoing amplification by amplifier 10. Distortion of the amplified signal $V_{RF2}$ is reduced as the inverse signal distortion due to the nonlinear conductance of the main transistor M1 adds with inherent signal distortion caused by nonlinear transconductance gm of the main transistor M1. In contrast, if the main transistor M1 is a BJT and the linearization circuitry 32 is configured to maintain a Q-point between a saturation region and an active region.

Figure 3:
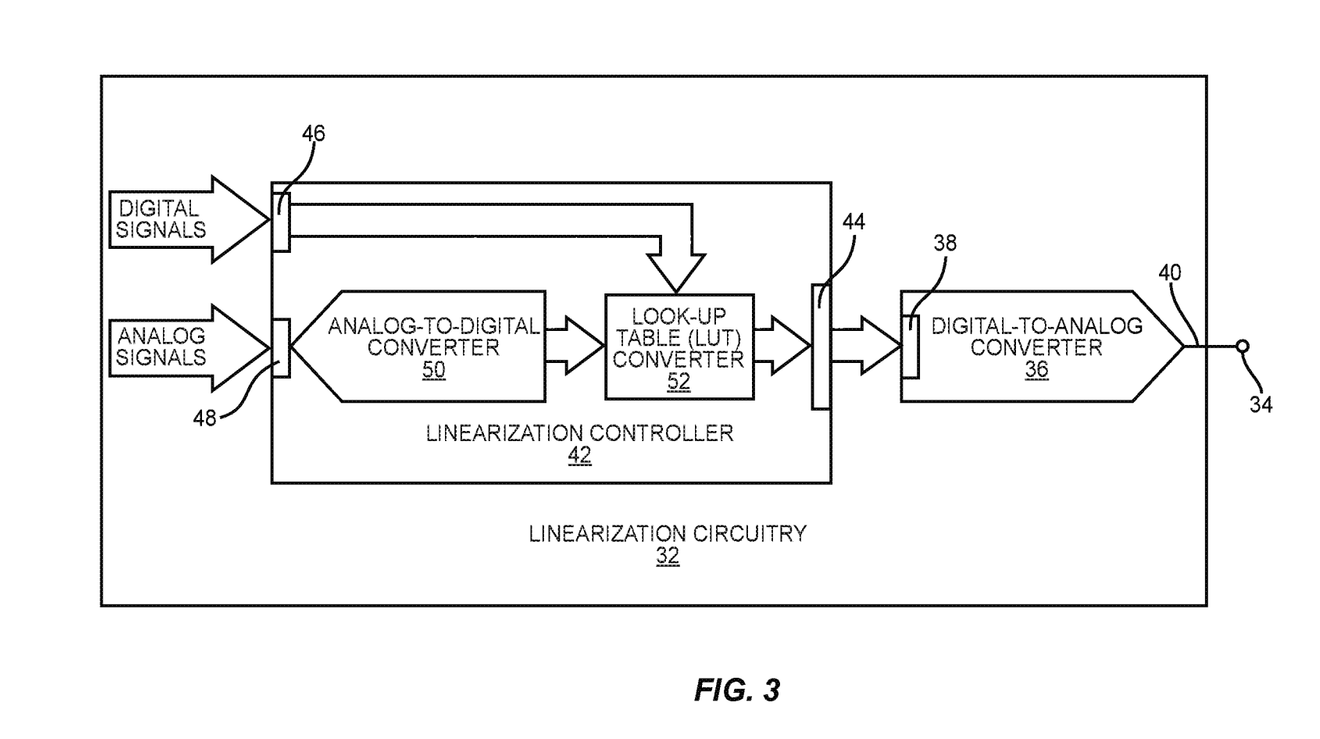
FIG. 3 is a circuit diagram of an exemplary embodiment of linearization circuitry included in the amplifier.

FIG. 3 is a circuit diagram of an exemplary embodiment of linearization circuitry 32. In this exemplary embodiment, the linearization circuitry includes a digital-to-analog converter 36 that has a digital signal input 38 and an analog output 40 that is coupled to the bias output terminal 34 (FIG. 1).

In some embodiments, the digital-to-analog converter 36 is of the current type that generates steps of current through the analog output 40. The steps of current correspond directly to digital values received at the digital signal input 38. A current-type digital-to-analog converter (CDAC) is usable to control the base current of a BJT. Therefore, a CDAC version of the digital-to-analog converter 36 is a convenient choice when the cascode transistor M2 is a BJT.

In other embodiments, the digital-to-analog converter 36 is of the voltage type that generates steps of voltage at the analog output 40. The steps of voltage correspond directly to digital values received at the digital signal input 38. A voltage-type digital-to-analog converter (VDAC) is usable to control gate-to-source voltage of a FET. Therefore, a VDAC is a convenient choice when the cascode transistor M2 is a FET. However, it is to be understood that either of the VDAC or CDAC type analog-to-digital converter is usable to control main current flow through either a BJT or a FET. In some embodiments, the main transistor M1 and the cascode transistor M2 are both of a FET type. In other embodiments, the main transistor M1 and the cascode transistor M2 are both of a BJT type. In yet other embodiments, the main transistor M1 is of a FET type and the cascode transistor M2 is of the BJT type. In still yet other embodiments, the main transistor M1 is of a BJT type and the cascode transistor M2 is of the FET type.

A linearization controller 42 has a digital output 44 coupled to the digital signal input 38 to control magnitude for the bias signal generated by the digital-to-analog converter 36. The linearization controller 42 receives digital information through a digital port 46. Examples of digital information received at digital port 46 include but are not limited to frequency band information and process information. Digital information can be transferred to the digital port 46 from a baseband processor (not shown) over an input/output bus such as an RF front-end (RFFE) interface. Analog signals such as supply voltage to the amplifier 10 and temperature of the amplifier 10 are transmitted to an analog input port 48. An analog-to-digital converter 50 within the linearization controller 42 converts the analog signals to digital information.

A lookup table (LUT) 52 receives digital information from both the analog-to-digital converter 50 and the digital port 46. The LUT 52 holds an array of digital values that are convertible to bias signal levels by the digital-to-analog converter 36. The LUT 52 passes the digital values to the digital-to-analog converter 36 through the digital output 44. Digital information received by the LUT 52 has associated digital values within the array of digital values. For example, digital information such as a particular frequency band of operation will have a corresponding digital value within the array of digital values. A factory calibration of the amplifier 10 is used to associate appropriate digital values with digital information that is received by the LUT 52.

An analog signal such as temperature is converted to digital information first by the analog-to-digital converter 50. The digital information associated with the temperature signal also has a corresponding digital value within the array of digital values after the factory calibration. In either case, the digital information received by the LUT is converted to an appropriate bias signal by the digital-to-analog converter 36 and is output to the bias output terminal 34 in order to maintain the Q-point of the main transistor M1 within the nonlinear conductance region in response to changing conditions represented by received digital information. For example, the Q-point of the main transistor M1 moves with changing temperature. The linearization controller 42 responds to the change in temperature by automatically adjusting the bias signal applied to the second control terminal 26 of the cascode transistor M2. This action causes the main current $I_{M1}$, the cascode voltage $V_{M2}$, and the main voltage $V_{M1}$ to adjust in a direction to force the Q-point of the main transistor M1 to remain at a desired location in the nonlinear conductance region.

Figure 4:
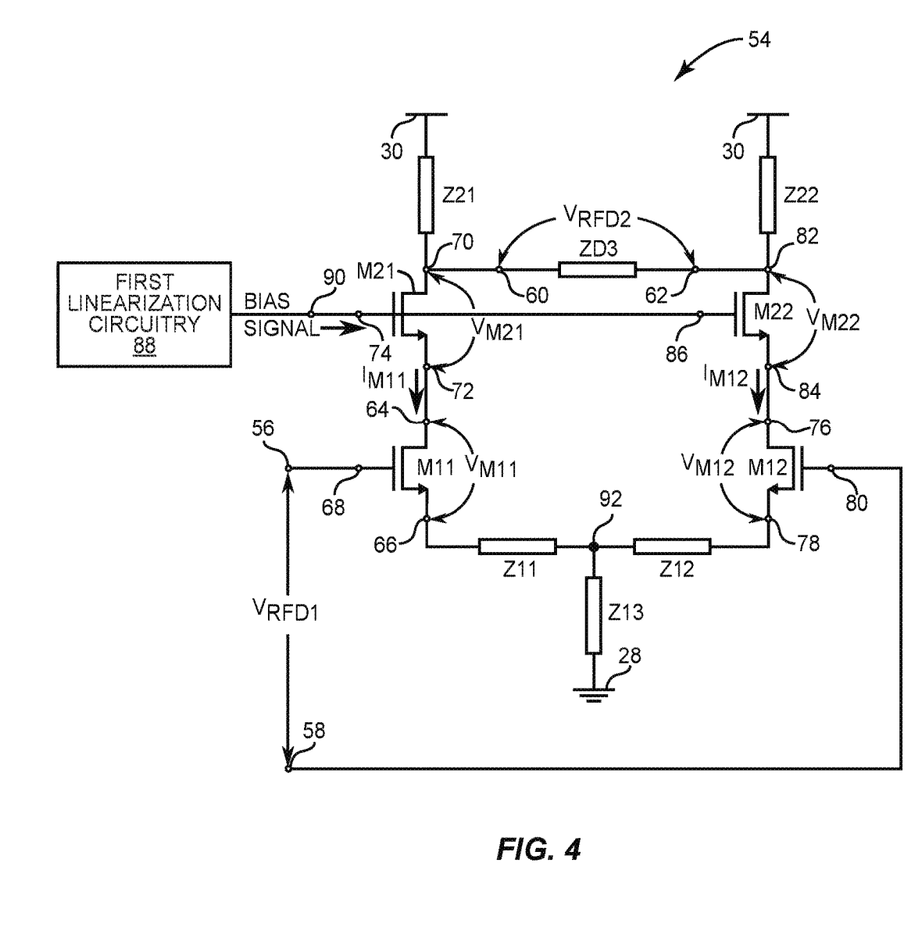
FIG. 4 is a circuit diagram of an exemplary embodiment of differential-type amplifier having improved linearity in accordance with the present disclosure.

FIG. 4 is a circuit diagram of an exemplary embodiment of differential-type amplifier 54 that is constructed in accordance with the present disclosure. The amplifier 54 has a first RF input terminal 56 and a second RF input terminal 58 for receiving a differential signal voltage $V_{RFD1}$. The amplifier 54 also includes a first RF output terminal 60 and a second RF output terminal 62 for outputting an amplified differential signal voltage $V_{RFD2}$.

The amplifier 54 also includes a first main transistor M11 having a first current input terminal 64, a first current output terminal 66, and a first control terminal 68 coupled to the first RF input terminal 56. A first cascode transistor M21 has a second current input terminal 70 coupled to the first RF output terminal 60, a second current output terminal 72 coupled to the first current input terminal 64, and a second control terminal 74.

Further included in amplifier 54 is a second main transistor M12 having a third current input terminal 76, a third current output terminal 78, and a third control terminal 80 coupled to the second RF input terminal 58. A second cascode transistor M22 has a fourth current input terminal 82 coupled to the second RF output terminal 62, a fourth current output terminal 84 coupled to the third current input terminal 76, and a fourth control terminal 86 that in this particular embodiment is coupled to the second control terminal 74 of the first cascode transistor M21.

First linearization circuitry 88 has a first bias output terminal 90 coupled to the second control terminal 74. The first linearization circuitry 88 is configured to generate a first bias signal at the first bias output terminal 90 to maintain a first quiescent point (Q-point) of the first main transistor M11 for a given load ZD3 coupled between the first RF output terminal 60 and the second RF output terminal 62 such that output conductance of the first main transistor M11 decreases nonlinearly with increasing main voltage $V_{M11}$ and increases nonlinearly with decreasing main voltage $V_{M11}$. In this particular embodiment the first linearization circuitry 88 includes a linearization controller that is identical to linearization controller 42 and responds to a change in digital information such as a change in temperature by automatically adjusting the bias signal applied to the second control terminal 74 of the first cascode transistor M21. This action causes a first main current $I_{M11}$, a first cascode voltage $V_{M21}$, and a first main voltage $V_{M11}$ to adjust in a direction to force the Q-point of the main transistor M11 to remain at a desired location in the nonlinear conductance region of transistor M11. Moreover, in this particular embodiment, the bias signal of the first linearization circuitry 88 is also applied to the fourth control terminal 86 of the second cascode transistor M22. In response, a second main current $I_{M12}$, a second cascode voltage $V_{M22}$, and a second main voltage $V_{M12}$ adjust in a direction to force the Q-point of the second main transistor M12 to remain at a desired location in the nonlinear conductance region of transistor M12.

In an exemplary embodiment depicted in FIG. 4, the first current output terminal 66 is coupled to a long-tailed node 92 through a first impedance element Z11. The third current output terminal 78 is coupled to the long-tailed node 92 through a second impedance element Z12. The long-tailed node 92 is coupled to the first fixed voltage node 28 through a third impedance element Z13. In the exemplary embodiment of FIG. 4, a first fixed voltage node is at ground potential. The second current input terminal 70 is coupled to the supply voltage node 30 though a fourth impedance element Z21. The fourth current input terminal 82 is coupled to the supply voltage node 30 through a fifth impedance element Z22. The embodiment of FIG. 4 provides improved linearization when the first main transistor M11 has matched characteristics with the second main transistor M12 and the first cascode transistor M21 has matched characteristics with the second cascode transistor M22. However, if the characteristics between the first main transistor M11 and the second main transistor M12 and the first cascode transistor M21 and the second cascode transistor M22 do not desirably match, a different embodiment is recommended.

Figure 5:
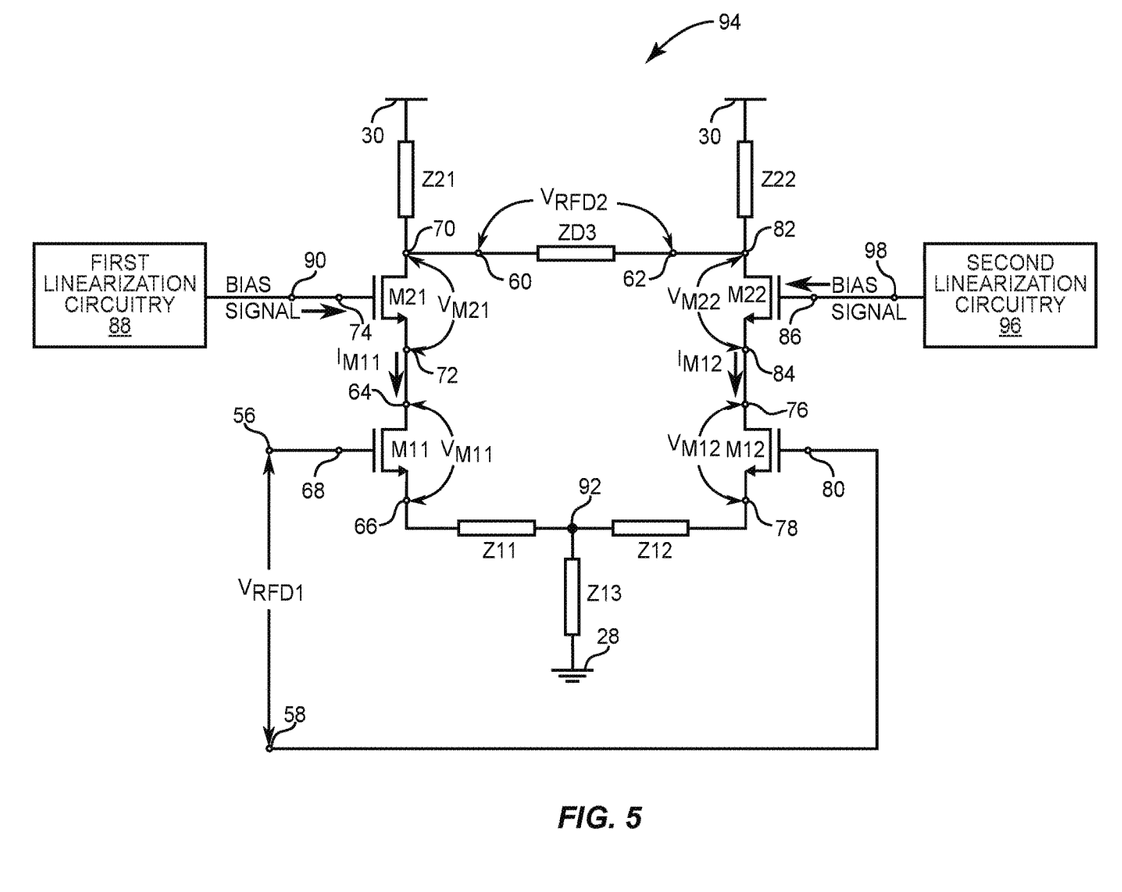
FIG. 5 is a circuit diagram of an exemplary embodiment of yet another differential-type amplifier having improved linearity in accordance with the present disclosure.

In this regard, FIG. 5 is a circuit diagram of an exemplary embodiment of yet another differential-type amplifier 94 having improved linearity in accordance with the present disclosure. In this embodiment, a second linearization circuitry 96 generates a separate bias signal through a second bias output terminal 98. The second linearization circuitry 96 is identical to the first linearization circuitry with the likely exception of having different data values in the LUT 52 due to different calibration data for the second main transistor M12 and the second cascode transistor M22 as opposed to the calibration data for the first main transistor M11 and the first cascode transistor M21.

In operation, the first linearization circuitry 88 will apply a first bias signal to the second control terminal 74 of the first cascode transistor M21. The first bias signal will in turn cause the first main current $I_{M11}$, the first cascode voltage $V_{M21}$, and the first main voltage $V_{M11}$ to adjust in a direction to force the Q-point of the main transistor M11 to remain at a desired location in the nonlinear conductance region of transistor M11. Similarly, the second linearization circuitry 96 will apply a second bias signal to the control terminal 86 of the second cascode transistor M22. In response, the second main current $I_{M12}$, the second cascode voltage $V_{M22}$, and the second main voltage $V_{M12}$ adjust in a direction to force a Q-point of the second main transistor M12 to remain at a desired location in the nonlinear conductance region of transistor M12.

Figure 6:
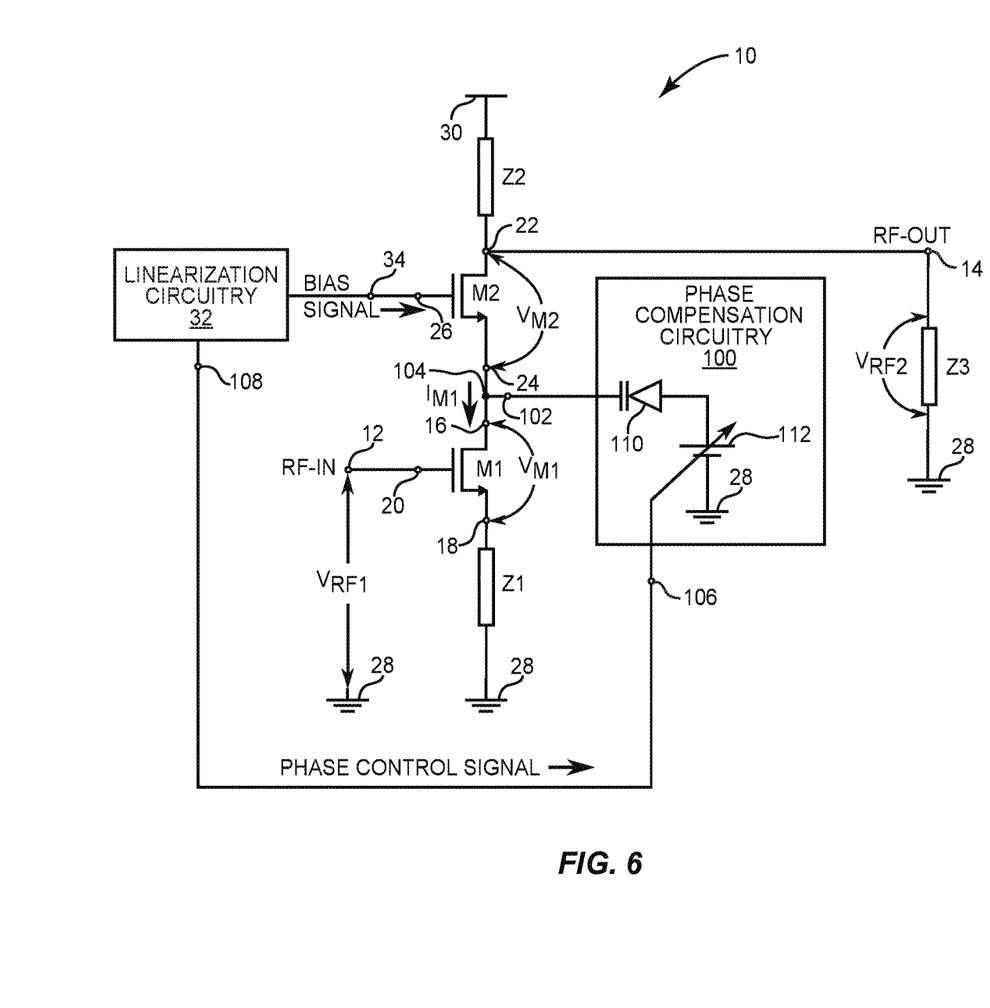
FIG. 6 is a circuit diagram of a modified version of the first embodiment of FIG. 1 that compensates amplitude modulation-phase modulation distortion.

While the embodiments disclosed above correct amplitude modulation-amplitude modulation (AM-AM) distortion, an additional circuitry is employable to correct AM-phase modulation (AM-PM) distortion. FIG. 6 is a circuit diagram of a modified version of the first embodiment of FIG. 1 that compensates AM-PM distortion. In this modified version of the amplifier 10, phase compensation circuitry 100 is included to further linearize amplifier 10 by compensating for AM-PM distortion. Phase compensation circuitry 100 has a phase terminal 102 coupled to a node 104 between the main transistor M1 and the cascode transistor M2. The phase compensation circuitry 100 also includes a phase control input terminal 106. The linearization circuitry 32 is also modified to include a phase control output terminal 108 that is coupled to the phase control input terminal 106. The linearization circuitry 32 generates a phase control signal that compensates phase distortion as the signal voltage $V_{RF1}$ is being amplified by the amplifier 10. In at least one embodiment, the phase compensation circuitry 100 is made up of a varactor diode 110 coupled in series with a variable voltage source 112. The series combination of the varactor diode 110 and the variable voltage source 112 is coupled between the phase terminal 102 and the first fixed voltage node 28, which in this exemplary embodiment is at ground potential. The linearization circuitry generates the phase control signal in response to digital information such as process, frequency band of operation, supply voltage, and temperature. The phase compensation circuitry 100 works the same with either embodiment of the differential-type amplifiers of FIG. 4 and FIG. 5. In those embodiments, the phase terminal 102 is coupled between the first main transistor M11 and the first cascode transistor M12, and the second main transistor M21 and the second cascode transistor M22.

Figure 7:
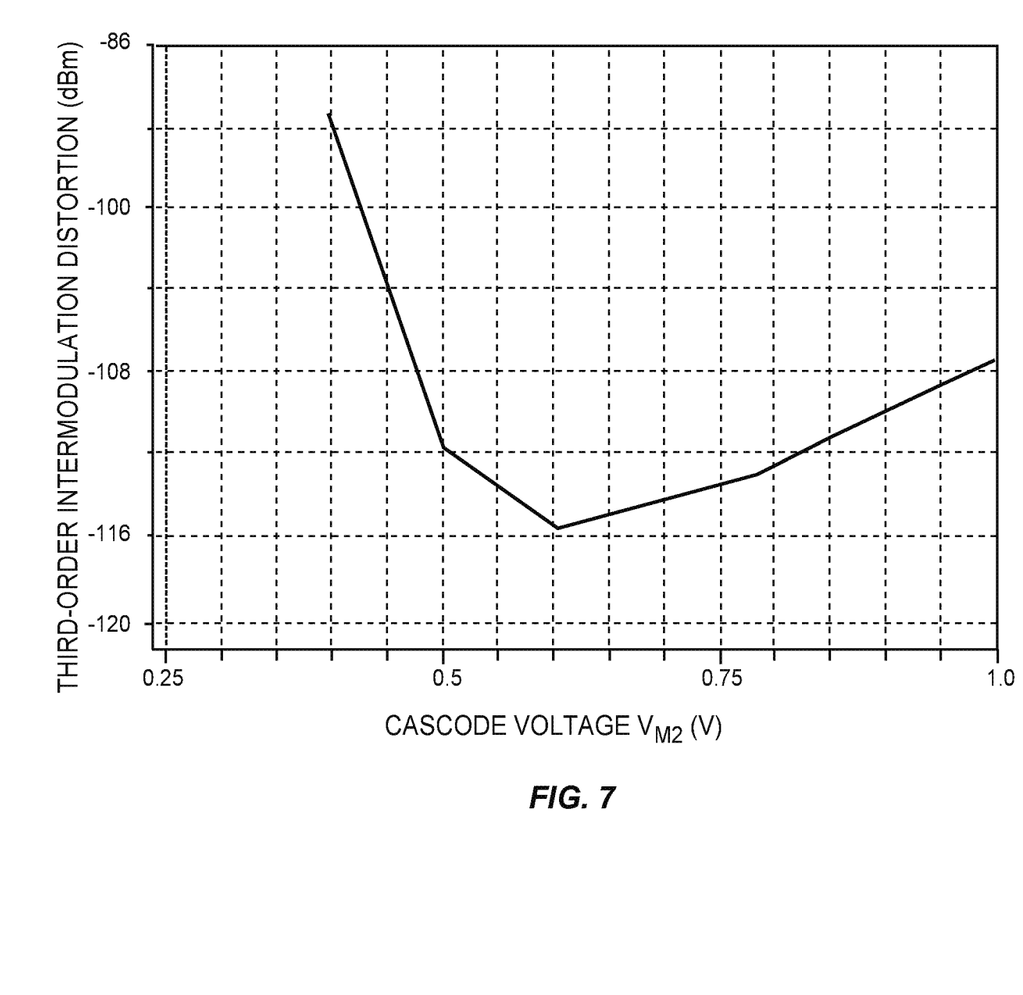
FIG. 7 is a graph of third-order intermodulation distortion versus the cascode voltage for the embodiment of FIG. 6.

FIG. 7 is a graph of third-order intermodulation distortion versus the cascode voltage $V_{M2}$ for the embodiment of FIG. 6. The graph illustrates an improvement in linearity of between 10 dB and 12 dB with a relatively very low third-order intermodulation distortion of −116 dBm. Overall, a 10-12 dB improvement in third-order intermodulation distortion results in a 5-6 dB improvement in input third-order intercept point for amplifier 10.

Those skilled in the art will recognize improvements and modifications to the preferred embodiments of the present disclosure. All such improvements and modifications are considered within the scope of the concepts disclosed herein and the claims that follow.

What is claimed is:

1. An amplifier having a radio frequency (RF) input terminal for receiving a signal voltage and an RF output terminal for outputting an amplified signal voltage comprising:
   a main transistor having a first current input terminal, a first current output terminal, and a first control terminal coupled to the RF input terminal;
   a cascode transistor having a second current input terminal coupled to the RF output terminal, a second current output terminal coupled to the first current input terminal, and a second control terminal; and
   linearization circuitry having a bias output terminal coupled to the second control terminal and configured to generate a bias signal at the bias output terminal to maintain a quiescent point of the main transistor for a given load coupled to the RF output terminal such that output conductance of the main transistor decreases nonlinearly as a main voltage of the main transistor increases and increases nonlinearly as the main voltage of the main transistor decreases, wherein the linearization circuitry comprises:
   a linearization controller comprising:
      a digital port configured to receive digital information from an external processor; and
      a lookup table coupled to the digital port and configured to match digital information received through the digital port with digital values;
      a digital output through which the digital values are passed; and
   a digital-to-analog converter having a digital signal input coupled to the digital output and an analog output coupled to the bias output terminal, wherein the digital-to-analog converter generates the bias signal that passes through the bias output terminal.

2. The amplifier of claim 1 wherein the digital information originates from a baseband processor.

3. The amplifier of claim 2 wherein the digital information is frequency band of operation.

4. The amplifier of claim 1 wherein the digital-to-analog converter is of a voltage type.

5. The amplifier of claim 1 wherein the digital-to-analog converter is of a current type.

6. The amplifier of claim 1 wherein the linearization controller further comprises an analog-to-digital converter having an analog signal input for receiving analog signals and wherein the lookup table is further configured to receive digital information from the analog-to-digital converter.

7. The amplifier of claim 6 wherein one of the analog signals is process.

8. The amplifier of claim 6 wherein one of the analog signals is supply voltage of the amplifier.

9. The amplifier of claim 6 wherein one of the analog signals is temperature of the amplifier.

10. The amplifier of claim 1 further comprising phase compensation circuitry coupled between a fixed voltage node and a phase node between the main transistor and the cascode transistor.

11. The amplifier of claim 10 wherein the phase compensation circuitry comprises a series combination of a varactor diode and a variable voltage source, wherein the variable voltage source is controlled by the linearization circuitry.

12. The amplifier of claim 1 wherein the main transistor and the cascode transistor are both of a field-effect transistor type.

13. The amplifier of claim 1 wherein the main transistor and the cascode transistor are both of a bipolar junction transistor type.

14. The amplifier of claim 1 wherein the main transistor is a field-effect transistor and the linearization circuitry is configured to maintain the quiescent point of the main transistor in an early saturation region.

15. The amplifier of claim 1 wherein the main transistor is a bipolar junction transistor and the linearization circuitry is configured to maintain a quiescent point between a saturation region and an active region.

16. An amplifier having a first RF input terminal and a second RF input terminal for receiving a differential signal voltage and a first RF output terminal and a second RF output terminal for outputting an amplified differential signal voltage comprising:

a first main transistor having a first current input terminal, a first current output terminal, and a first control terminal coupled to the first RF input terminal;

a first cascode transistor having a second current input terminal coupled to the first RF output terminal, a second current output terminal coupled to the first current input terminal, and a second control terminal;

a second main transistor having a third current input terminal, a third current output terminal, and a third control terminal coupled to the second RF input terminal;

a second cascode transistor having a fourth current input terminal coupled to the second RF output terminal, a fourth current output terminal coupled to the third current input terminal, and a fourth control terminal; and first linearization circuitry having a first bias output terminal coupled to the second control terminal and configured to generate a first bias signal at the first bias output terminal to maintain a first quiescent point of the first main transistor for a given load coupled between the first RF output terminal and the second RF output terminal such that output conductance of the first main transistor decreases nonlinearly as a first main voltage of the first main transistor increases and increases nonlinearly as the first main voltage of the first main transistor decreases.

17. The amplifier of claim 16 wherein the first bias output terminal is further coupled to the fourth control terminal to maintain a second quiescent point of the second main transistor for the given load coupled between the first RF output terminal and the second RF output terminal such that output conductance of the second main transistor decreases nonlinearly as a second main voltage of the second main transistor increases and increases nonlinearly as the second main voltage of the second main transistor decreases.

18. The amplifier of claim 16 further comprising second linearization circuitry having a second bias output terminal coupled to the fourth control terminal to maintain a second quiescent point of the second main transistor for the given load coupled between the first RF output terminal and the second RF output terminal such that output conductance of the second main transistor decreases nonlinearly as a second main voltage of the second main transistor increases and increases nonlinearly as the second main voltage of the second main transistor decreases.

* * * * *